United States Patent
Younes et al.

(10) Patent No.: US 11,588,436 B2
(45) Date of Patent: Feb. 21, 2023

(54) HYBRID RENEWABLE SYSTEM FOR HEAT AND POWER PRODUCTION

(71) Applicant: Saudi Arabian Oil Company, Dhahran (SA)

(72) Inventors: Mourad Younes, Dhahran (SA); Issam Gereige, Thuwal (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/928,732

(22) Filed: Jul. 14, 2020

(65) Prior Publication Data
US 2022/0021336 A1    Jan. 20, 2022

(51) Int. Cl.
*H02S 40/44*    (2014.01)
*F24S 20/00*    (2018.01)

(52) U.S. Cl.
CPC ........... *H02S 40/44* (2014.12); *F24S 2020/17* (2018.05)

(58) Field of Classification Search
CPC ....... H01L 31/00–078; Y02E 10/50–60; H02S 10/00–40; H02S 40/00–44
USPC .................................................. 136/243–265
See application file for complete search history.

(56) References Cited

U.S. PATENT DOCUMENTS

| | | | |
|---|---|---|---|
| 4,106,952 A * | 8/1978 | Kravitz | H01L 23/38 126/634 |
| 9,732,986 B2 | 8/2017 | Al-Ansary et al. | |
| 9,778,534 B2 | 10/2017 | Tran et al. | |
| 2012/0298200 A1 | 11/2012 | Niggemann et al. | |
| 2015/0053266 A1* | 2/2015 | Chen | F24S 23/31 136/259 |
| 2016/0180982 A1 | 6/2016 | Engel-Herbert et al. | |
| 2016/0223878 A1 | 8/2016 | Tran et al. | |
| 2017/0155360 A1* | 6/2017 | Hahn | H01L 31/048 |

(Continued)

FOREIGN PATENT DOCUMENTS

| | | | |
|---|---|---|---|
| CN | 102736342 | * | 10/2012 |
| CN | 208563680 | * | 3/2019 |

(Continued)

OTHER PUBLICATIONS

DE19809883 English translation (Year: 1999).*

(Continued)

*Primary Examiner* — Bach T Dinh
(74) *Attorney, Agent, or Firm* — Fish & Richardson P.C.

(57) ABSTRACT

The present disclosure describes a hybrid photovoltaic (PV) panel that includes: a first photovoltaic (PV) layer comprising photovoltaic cells capable of converting energy from incident solar power into electricity; a second transparent layer arranged underneath the first PV layer such that a portion of the incident solar power passes through; and a third thermal collection layer arranged underneath the second transparent layer and comprising absorbing material capable of absorbing energy from the portion of the incident solar power that has passed through the second transparent layer, wherein the second transparent layer includes a thermally insulating material to provide a thermal barrier between the first PV layer and the third thermal collection layer such that when the PV panel is operated, the first PV layer operates at a temperature lower than a temperature of the thermal collection layer.

13 Claims, 6 Drawing Sheets

(56) References Cited

U.S. PATENT DOCUMENTS

| | | | | |
|---|---|---|---|---|
| 2018/0231861 | A1* | 8/2018 | Franz | H02S 40/20 |
| 2019/0084428 | A1* | 3/2019 | Ebert | H01L 31/048 |
| 2019/0145161 | A1 | 5/2019 | Agrawal et al. | |
| 2020/0026141 | A1 | 1/2020 | Brown et al. | |

FOREIGN PATENT DOCUMENTS

| | | | |
|---|---|---|---|
| CN | 209544369 | * | 10/2019 |
| CN | 111006400 | | 4/2020 |
| DE | 19809883 | * | 9/1999 |
| ES | 2713096 | * | 5/2019 |

OTHER PUBLICATIONS

CN208563680 English translation (Year: 2019).*
CN209544369 English translation (Year: 2019).*
ES2713096 English translation (Year: 2019).*
Rao et al, Influence of Molar Ratios of Precursor, Catalyst, Solvent and Water on Monolithicity and Physical Properties of TMOS Silica Aerogels, Journal of Sol-Gel Science and Technology, 3, 205-217, 1994. (Year: 1994).*
Chandler, "Getting more heat out of sunlight," Phys Org, Jul. 2019, 3 pages.
explainthatstuff.com [online], ""Smart" windows (electrochromic glass)," available on or before Jul. 20, 2011, via Internet Archive: Wayback Machine URL <https://web.archive.org/web/20110720100002/https://www.explainthatstuff.com/electrochromic-windows.html>, retrieved on Oct. 8, 2020, URL <https://www.explainthatstuff.com/electrochromic-windows.html>, 7 pages.
Husain et al., "A review of transparent solar photovoltaic technologies," Renewable and Sustainable Energy Reviews, 2018, 94:779-791, 13 pages.
Ramos et al., "Hybrid photovoltaic-thermal solar systems for combined heating, cooling and power provision in the urban environment," Energy Conversion and Management, 2017, 150:838-850, 13 pages.
Zhao et al., "Harnessing Heat Beyond 200 °C from Unconcentrated Sunlight with Nonevacuated Transparent Aerogels," ACS Nano, Jun. 2019, 3(7):7508-7516, 9 pages.
PCT International Search Report and Written Opinion in International Appln. No. PCT/US2021/041526, dated Nov. 5, 2021, 15 pages.

* cited by examiner

HYBRID RENEWABLE SYSTEM FOR HEAT AND POWER PRODUCTION

TECHNICAL FIELD

This disclosure generally relates to solar panels, in particular, solar panels for generating both electric power and thermal energy.

BACKGROUND

Residential, commercial and industrial applications often demand power (as electricity) as well as heat. Power and heat are often provided by separate devices or sourced differently. A shifting concern towards climate change have driven a significant increase in renewable energy production using, for example, solar Photo-Voltaic (PV) panels. Against this backdrop, renewable energy integration at residential homes, commercial sites, and industrial plants has generated more and more intensified interest.

SUMMARY

In one aspect, the present disclosure describes a hybrid photovoltaic (PV) panel that includes: a first photovoltaic (PV) layer comprising photovoltaic cells capable of converting energy from incident solar power into electricity; a second transparent layer arranged underneath the first PV layer such that a portion of the incident solar power passes through; and a third thermal collection layer arranged underneath the second transparent layer and comprising absorbing material capable of absorbing energy from the portion of the incident solar power that has passed through the second transparent layer, wherein the second transparent layer includes a thermally insulating material to provide a thermal barrier between the first PV layer and the third thermal collection layer such that when the PV panel is operated, the first PV layer operates at a temperature lower than a temperature of the thermal collection layer.

Implementations may include one or more of the following features.

The PV panel may additionally include: a fourth electrochromic layer configured to control the portion of the incident solar power that reaches the third thermal collection layer. The fourth electrochromic layer may be sandwiched between the second transparent layer and the third thermal collection layer. In this example, when the PV panel is operated, the fourth electrochromic layer may operate at between about 0° C. and 200° C. The fourth electrochromic layer may also be sandwiched between the first PV layer and the second transparent layer. In this example, when the PV panel is operated, the fourth electrochromic layer operates at between about −20° C. and about 150° C. The fourth electrochromic layer may be switchable between a first state and a second state, wherein the first state allows a majority of the portion of the incident solar power to reach the third thermal collection layer, and wherein the second state reflects a majority of the portion of the incident solar power to the first PV layer. The fourth electrochromic layer may be adjustable by a voltage to switch between the first state and the second state. The fourth electrochromic layer may be constructed as part of the second transparent layer. The fourth electrochromic layer may also be constructed as part of the third thermal collection layer. The fourth electrochromic layer may have a thickness between about 1 micrometer and about 3 millimeter.

The first PV layer may include a plurality of transparent or translucid solar cells encapsulated in a polymer material, wherein the plurality of transparent solar cells comprise one of: an organic silicon material, an amorphous silicon material, or a crystalline silicon material, and wherein the polymer material comprises ethyl vinyl acetate (EVA). The PV panel may further include a fifth layer located underneath the third thermal collection layer, wherein the third thermal collection layer is configured to transfer the energy absorbed from the portion of the incident solar power to the fifth layer by conduction and convection. The PV panel may further include a sixth transparent layer coated on the first PV layer, wherein the sixth transparent layer comprises a glass or a polymer to protect the PV layer while allowing the incident solar power to pass through to the first PV layer.

In another aspect, the present disclosure describes a method for operating a photovoltaic (PV) panel comprising an electrochromic layer, the method including: adjusting a voltage applied to the electrochromic layer to control a portion of solar power that passes through a photovoltaic (PV) layer to reach a thermal collection layer, wherein the PV panel further comprises a transparent layer between the PV layer and the thermal collection layer, wherein the transparent layer comprises thermally insulation material to provide a thermal barrier between the photovoltaic layer and the thermal collection layer, and wherein the PV layer is operated at a temperature lower than a temperature of the thermal collection layer.

Implementations may include one or more of the following features.

Adjusting the voltage may cause the electrochromic layer to switch between a first state and a second state, wherein when the electrochromic layer is switched to the first state, the PV panel operates to convert incident solar power primarily into electricity by the PV layer, and wherein when the electrochromic layer is switched to the second state, the PV panel operates to convert the incident solar power into electricity by the PV layer as well as into thermal energy by the thermal collection layer separated from the PV layer. When an electricity demand is increased, the process may include adjusting the voltage to reduce the portion of solar power that passes through the PV layer to reach the thermal collection layer. When a thermal energy demand is increased, the process may include adjusting the voltage to increase the portion of solar power that passes through the PV layer to reach the thermal collection layer. The process may additionally include operating the electrochromic layer at between about 0° C. and 200° C. when the electrochromic layer is sandwiched between a transparent layer and the thermal collection layer. The process may further include operating the electrochromic layer at between about −20° C. and about 150° C. when the electrochromic layer is sandwiched between the PV layer and the transparent layer.

Implementations according to the present disclosure may be realized in computer implemented methods, hardware computing systems, and tangible computer readable media. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

The details of one or more implementations of the subject matter of this specification are set forth in the description,

DESCRIPTION OF DRAWINGS

Like reference numbers and designations in the various drawings indicate like elements.

DETAILED DESCRIPTION

The disclosed technology is directed to combining heat and power production in solar panels. While photovoltaic (PV) panels mainly developed for power production may allow to generate more energy per unit surface area, such systems suffer from a relatively inadequate heat management between the solar power part and the solar thermal part as high temperatures reduce the efficiency of solar PV cells. For illustration, light absorbing materials in solar cells, have a bandgap in the near-infrared region. As a result, these light absorbing material tend to absorb mainly the Ultra-Violet (UV) and visible portion of the solar spectrum. As a result, light from the remaining solar spectrum is either transmitted through the device or transformed to heat. In this context, the heat transformation has a negative impact on solar cell efficiency in that the output of solar cells decreases as operating temperature increases (e.g., power output loss of 0.3-0.4% for 1° C. above 25° C.). Hence, harvesting the wasted heat could be very advantageous in terms of a higher operating efficiency of the solar cell. Recent development in materials science and engineering has led to shifted interest in combining translucent or transparent solar PV cell with a solar thermal collector separated by a high thermally insulating transparent layer. In this context, some examples described in the present disclosure implement a unique layout that includes various layers to increase the efficiency of the energy capturing process. In other words, the solar energy that is not being used in the photo-electric conversion can be directed to heat production with minimal heat loss using a device configuration as described by some implementations.

Figure 1:
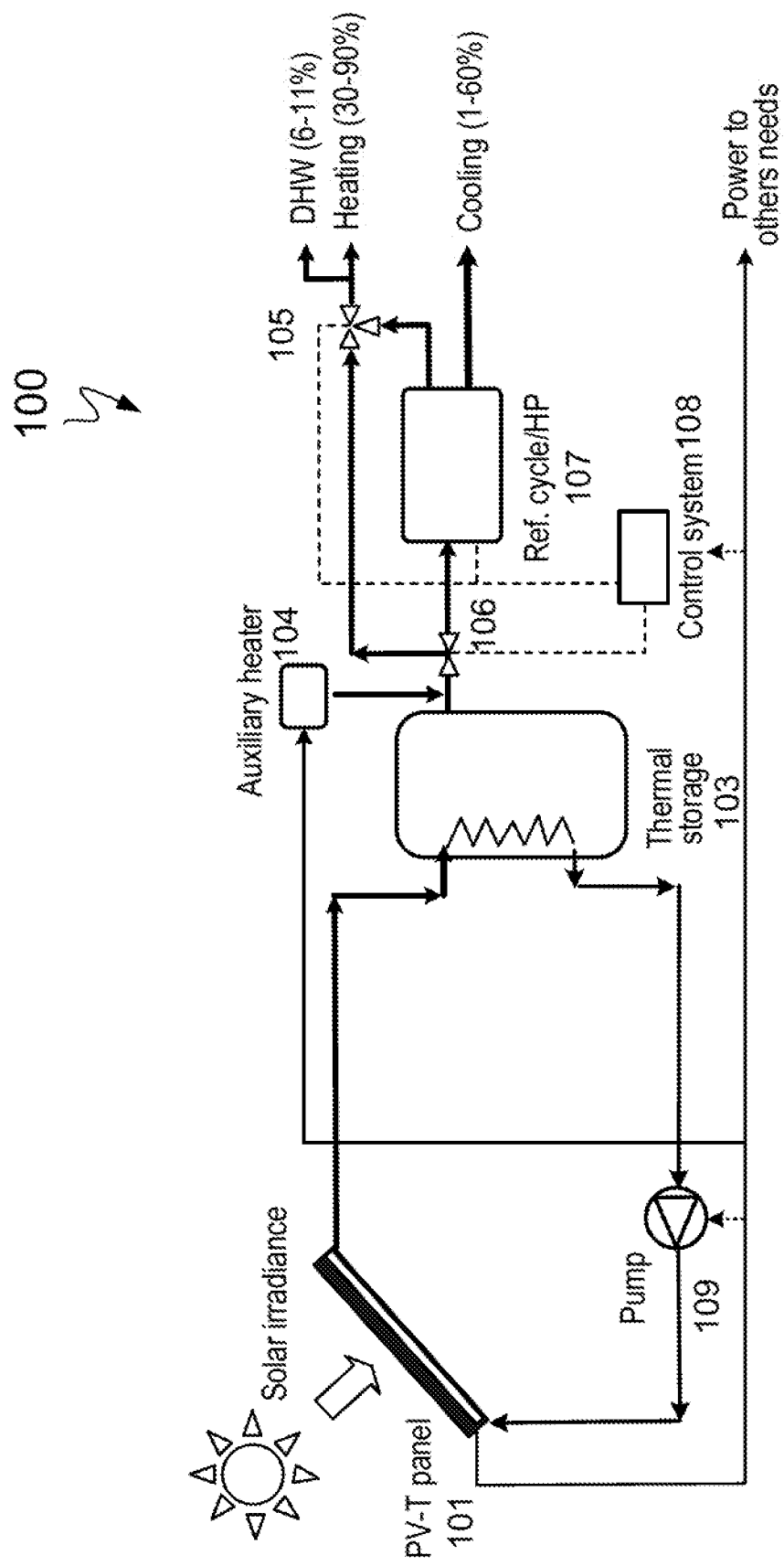
FIG. 1 illustrates an example of combining electricity and heat generation according to an implementation of the present disclosure.

FIG. 1 illustrates an example of combining electricity and heat generation in one system. This example explains a use case scenario that covers: (i) the combined space heating and domestic hot water demand; and (ii) the cooling demand, in which the photovoltaic-thermal system is sized such that the thermal output of the system can cover 60% of the domestic hot water demand and space heating (in winter) demand needs, while the electricity generated is used to power the household and drive a conventional split unit (in summer) (vapor compression refrigeration cycle) that covers the cooling demand. As illustrated, diagram 100 shows that solar energy irradiates photovoltaic-thermal (PV-T) panel 101. PV-T panel 101 is a hybrid panel that directs a first portion of the converted energy towards thermal storage 103 and a second portion of the converted energy as electrical power.

Here, the first portion of the converted energy is routed to thermal storage 103, which can feedpump 109 that serves as a feedback to PV-T panel 101. Thermal storage 103 may incorporate a reservoir of fluid or fluid and phase changing material with high thermal capacity, for example, a thermal capacity higher than water and or additives that prevent freezing in sub-zero temperatures. Thermal storage 103 may include insulating layers to prevent heat loss or dissipation. Thermal storage 103 may additionally incorporate resistors to aid or amplify energy storage. As illustrated, the second portion of converted energy may drive auxiliary heater 104 to introduce additional heating to thermal storage 103. Through 2-way switch 106, thermal energy at thermal storage 103 can provide cooling through absorption air conditioning unit (AC) 107, and heating and domestic hot water (DHW) through an additional 2-way switch 105. As indicated, in this example, 0-100% of the converted energy may be directed to providing DHW, 30-90% of the converted energy may be directed to provide heating, and 0-100% of the converted energy may be directed to provide cooling.

The second portion of the converted energy may provide electricity to pump 109 as a feedback to PV-T panel 101. The second portion of the converted energy may feed electricity to control system 108. Control system 108 may provide control signals to switch 106, switch 105, and HP 107.

For context, while photovoltaic (PV) panels mainly developed for power production may allow to generate more energy per unit surface area, such systems suffer from a relatively inadequate heat management between the solar power part and the solar thermal part as high temperatures reduce the efficiency of solar PV cells. Recent development in materials science and engineering has led to shifted interest in combining translucent or transparent solar PV cell with a solar thermal collector separated by a high thermally insulating transparent layer.

Figure 2:
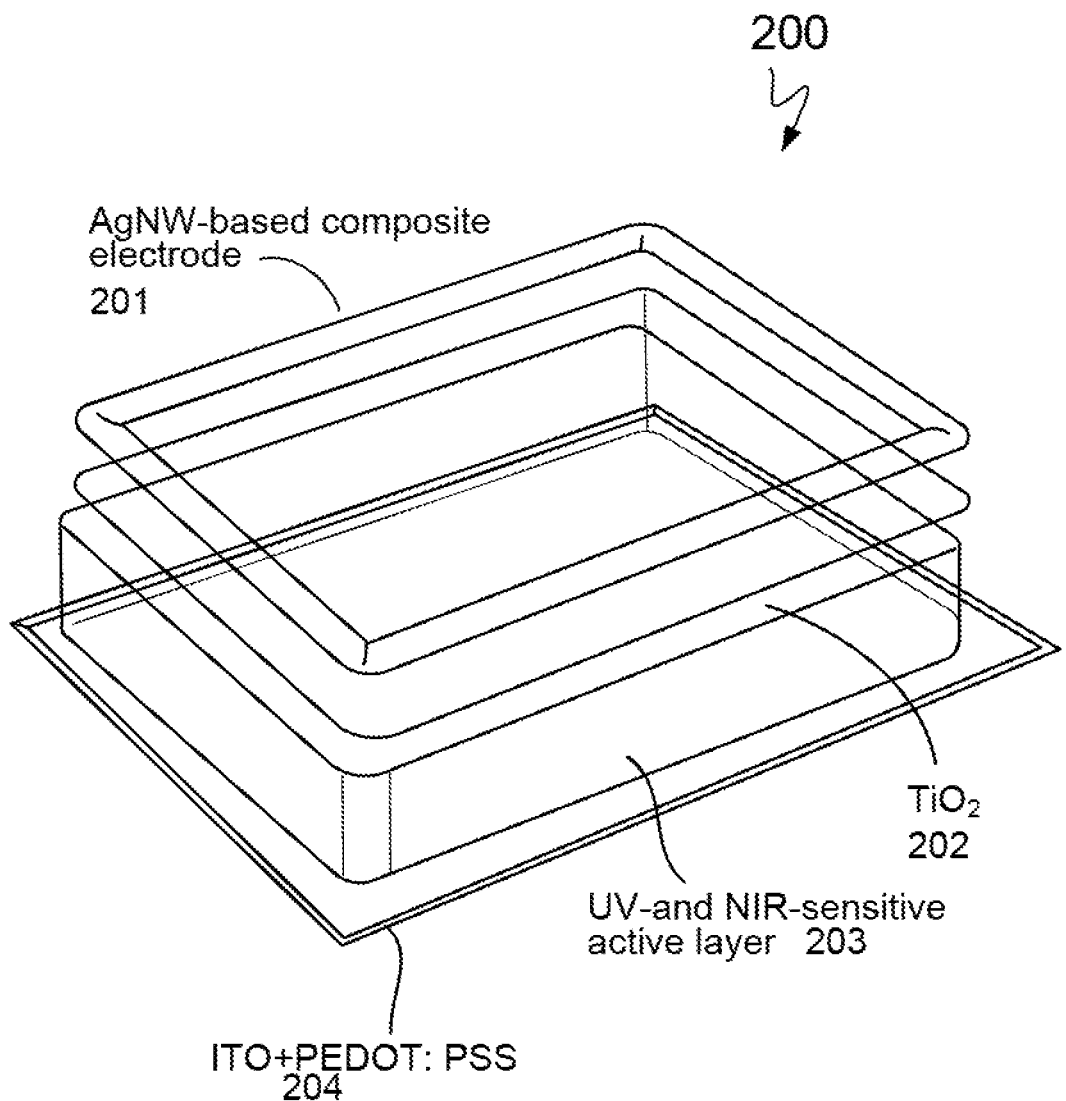
FIG. 2 illustrates an example of a transparent polymer solar cell according to an implementation of the present disclosure.

Referring to FIG. 2 for context, an example of a transparent polymer solar cell 200 includes electrode 201, metal oxide layer 202, UV-and-NIR (Near Infra-Red) sensitive active layer 203, and electrode 204. As illustrated, electrodes 201 and 204 are transparent, and active material is sandwiched in-between. In layer 203, the active material absorbs light in the UV and NIR regions. In one example, the active material has a polymer heterojunction as an electron donor and PCBM ([6,6]-phenyl-$C_{61}$-butyric acid methyl ester) as an electron acceptor with a 68% average transmission in the visible region. Layer 202 may include a metal oxide material, such as TiO2 or Al2O3, and organic transport materials. For electrode 204, ITO (indium tin oxide) is used as the electrode anode substrate coated with PEDOT:PSS (poly(3, 4-ethylenedioxythiophene) polystyrene sulfonate) as a modification and is placed at the bottom of the photovoltaic cell. The electrode placed on the top is judiciously chosen because organic materials are sensitive and might not survive the deposition process. As illustrated, for electrode 201, AgNW (silver nanowire) is spray coated on top of the active material, while a TiO2 sol-gel solution is used to connect and confirm the adhesion of AgNW to the photoactive layer.

Figure 3:
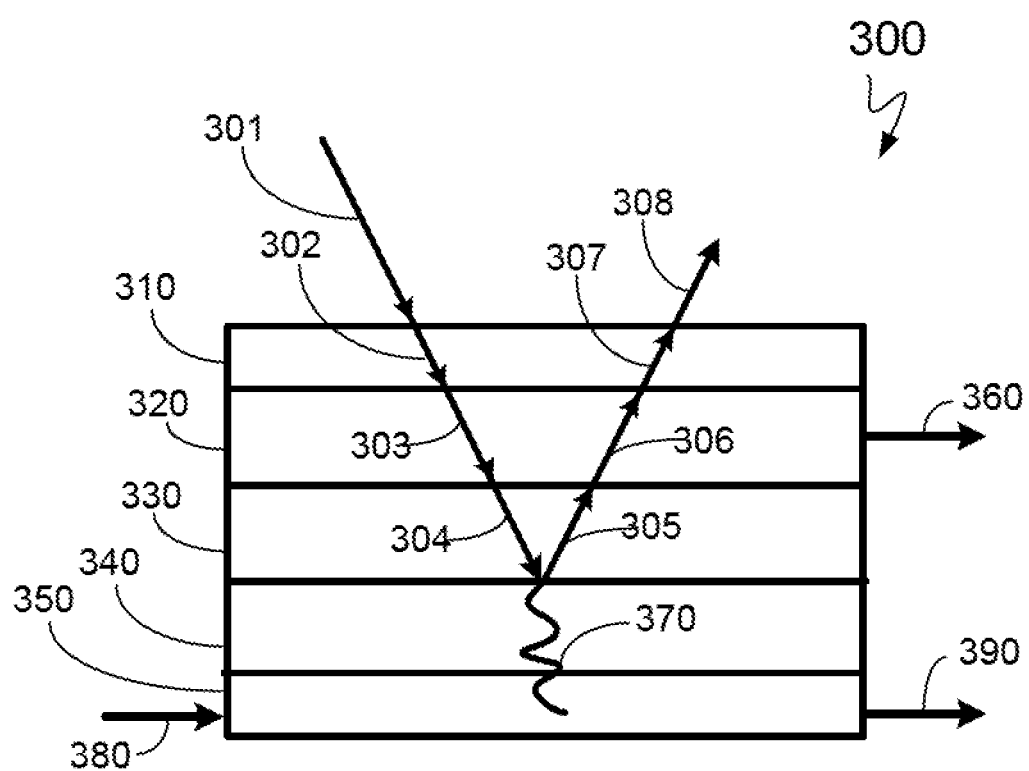
FIG. 3 illustrates an example of a photovoltaic panel according to an implementation of the present disclosure.

FIG. 3 illustrates an example of a configuration of a hybrid panel 300 according to some implementations. An incident beam 301 of photons reaches transparent layer 310. The incident beam 301 then traverses transparent layer 310 with minimum losses (e.g., less than 5%) and then becomes beam 302 to reach the transparent or translucent solar photo-voltaic layer 320 and generate electricity that is channeled out of the system through connection 360. In one example, transparent layer 310 is made of glass or polymer materials (e.g. polycarbonate) to allow beam 301 to cross through with minimum losses. Transparent layer 310 can be coated with an antireflection layer to minimize light reflection. Such layers may often be used for encapsulation of solar cells to protect solar cells against environmental parameters such as humidity and air contaminants. Transparent layer 310 may have thickness that varies between 0.1 to 3.2 millimeters.

Photovoltaic layer 320 may be made of transparent solar cells (e.g., organic, amorphous silicon) to facilitate increased light penetration into the thermal absorber. Tandem solar cell configurations can also be used to achieve higher power to electrical conversion efficiency. The solar cells are encapsulated in Ethyl Vinyl Acetate (EVA) or other suitable polymer. Other solar cells such as crystalline silicon can also be used. The solar cells can include bi-facial solar photovoltaic cells to produce electricity from incident and reflected photons. An example of such transparent solar cell has been described above in association with FIG. 2. Photovoltaic layer 320 may capture only a portion of beam 302 to produce electricity while the non-captured light/photons exit layer 320 as beam 303 to enter layer 330. As illustrated, solar cells can convert only a fraction of the solar energy into electricity.

Layer 330 is a thermal isolating layer while appearing as transparent or translucent. Layer 330 allows beam 303 to come through and exit as beam 304 while thermally insulating the photovoltaic layer 320 (above) from the heat collection layer 340 (underneath). The photons from beam 303 may come through layer 330 and exit through beam 304 to reach heat collection layer 340.

In some instances, layer 330 is an aerogel layer. In some examples, aerogel can be synthesized by controlling the hydrolysis and condensation reaction rates of TMOS (tetramethyl orthosilicate). The synthesis may use a mild basic catalyst (e.g., NH4OH) at a relatively low molar ratio (NH4OH-to-TMOS), for example, in the range of $10^{-3}$ to $10^{-4}$ to achieve a desired transparency. In some cases, the transparency of an aerogel can be characterized by a transmittance of 88% or better at a thickness of 10 mm or under. In some cases, the aerogel transmittance can be further improved by increasing the NH4OH-to-TMOS ratio from $1.5 \times 10^{-3}$ to $3.5 \times 10^{-2}$. Both the hydrolysis and condensation reactions are promoted by a high catalyst molar ratio (i.e., shorter gelation time), which enables the initial fast growth of silica particles and the subsequent abrupt ending of the growth because of the depletion of the precursors. The rapid reaction results in a uniform porous structure with smaller particles, which lower the strength of scattering and increase transmittance. The higher catalyst molar ratio reduces the scattering coefficients in the solar spectrum, and the effective scattering center diameter decreases by, for example, over 30%.

The aerogel is characterized as having low thermal conductivity. The aerogel layer 330 can thus reduce heat loss in the form of conductive heat loss. Layer 330 typical thickness varies between 2 to 10 millimeters.

Layer 340 may be a heat collection layer configured to absorb maximum amount of the energy in beam 304 and reflect minimum amount of energy through beam 305. In some case, layer 340 can absorb more than 80% of the energy in beam 304 and reflect less than 20% of the energy. In some cases, metallic materials, such as aluminum or copper, can be used. In these cases, black (or dark color) coatings can be applied to increase the thermal absorption. In other words, layer 340 captures thermal energy from the portion of solar power that passes through transparent layer 330 to reach layer 340. Beam 305 may cross the different transparent/translucent layers 330, 320, then 310 and back to the environment. In more detail, layer 340 is designed to have a high absorption factor and collect the heat and pass it to layer 350 by conduction and convection stream 370.

Layer 350 may be the thermal energy recovery layer. Layer 350 may be in direct contact with a heat transfer fluid (or air) that enters layer 350 through stream 380 and exit layer 350 through stream 390. The heat transfer fluid transfers the heat collected by layer 340 out of the hybrid panel configuration 300. In some instances, the heat transfer fluid may be circulating in layer 350 naturally as is the case of a heat pipe or through a forced circulation as is the case of a system with a circulation pump.

Figure 4:
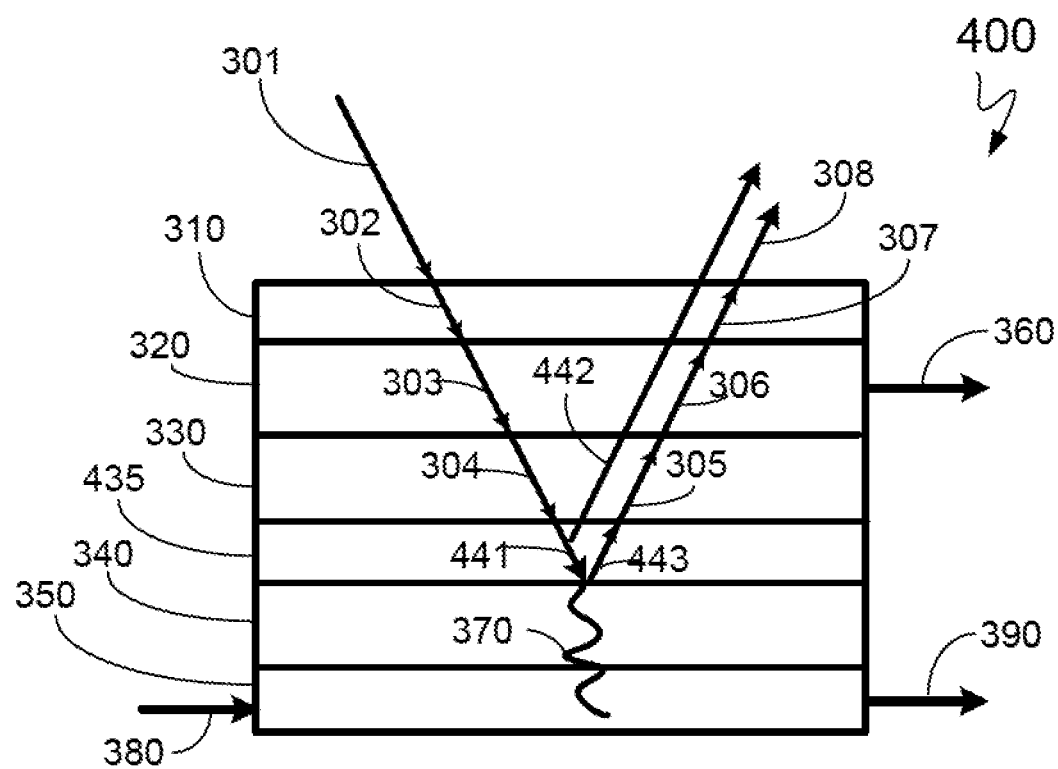
FIG. 4 illustrate example of another photovoltaic panel according to an implementation of the present disclosure.

FIG. 4 illustrate illustrates an example of a configuration of a hybrid panel 400 according to some implementations. As illustrated, either photovoltaic layer 320 or thermal insulating layer 330 may incorporate an electro-chromic function to reduce the transparency of the materials and reduce the transmission of light and photons down to thermal collection layer 340, thereby reducing the amount of heat generated by the hybrid panel. Specifically, FIG. 4 shows an example of placing electrochromic material in a separate layer 435. The energy needed to control the electrochromic layer can be provided from the solar cells. The electrochromic layer can be chosen from materials that reflect back the light into the upper layer. The process in FIG. 4 uses the same designation of beams and components as with the process presented in FIG. 3.

In more detail, beam 304 exiting layer 330 can enter into electro-chromic layer 435. Here, the electro-chromic layer 435 is configured to control the amount of light/photos that reach the thermal energy collection layer 340. Electrochromic layer 435 can be sandwiched between layer 330 and layer 340 as illustrated in FIG. 4, or can be sandwiched between layer 320 and layer 330. When the layer 435 is placed between layer 330 and layer 340, the operating temperature may be between 0 and 200° C. When the placement is between layer 20 and layer 30, the operating temperature of layer 35 would be between −20 and 150° C. Layer 330 in such instances may be similar in composition to the layer 330 presented in FIG. 3. Additionally or alternatively, layer 330 may include bi-facial solar photovoltaic cells to produce electricity from beam 441 and the reflected beams, especially beam 442 and beam 443.

As illustrated in FIG. 4, electro-chromic layer 435 can be adaptively configured to suit a changing environment. For example, when there is a significant demand for solar thermal energy and less demand for electrical power, electro-chromic layer 435 may be operated in transparent mode to allow for maximum beam/photons to cross through layer 435 down to the thermal collection layer 340, which becomes equivalent to the operation of the system as in FIG. 3.

On the other hand, when more electrical power is needed with less demand for thermal energy, layer 435 is operated in opaque/reflective mode to allow for no or small portion of beam 441 to cross trough and get collected by layer 340. To illustrate, a large portion of the energy may be reflected back through beam 442. In other words, the opaque mode includes a reflective surface that operates like a mirror. The reflective surface will reflect the light with no absorption. In this manner, reflected light would enter back layer 330 to produce more electrical power that would be channeled out of the layer through power line 360 or through an adjacent power line. As such, part of beam 442 would be absorbed in layer 330 and the remaining beam would exit the system as is the case for beams 305, 306, 307 and 308.

In sum, electrochromic layer 435 can be a separate layer or can be incorporated in layer 320 or layer 330 during manufacturing. In some cases, the thickness of electrochromic layer 435 can be in the range of 1 micron to 3 millimeters. An adjustable voltage can be applied to the electrochromic layer 435. In various examples, the voltage applicable to the electrochromic layer 435 can range from 1 to 4 voltages. By adjusting the voltage, electrochromic layer 435 can change from a transparent material to a reflective material. The inclusion of the electrochromic layer thus allows the system to control the ratio of the power and heat to suit the user requirements. In this manner, implementations of the present disclosure can isolate thermally the power production from heat generation, thereby adjustably controlling the distribution of energy between power production and heat generation on the photovoltaic panel. In contrast, prior art systems include additional components different from the photovoltaic panel and require the additional components to operate simultaneously to achieve a distribution of energy, which impedes the efficiency and responsiveness of the adjustment. In other words, prior art systems do not provide a compact and integrated solution and are incapable of operating at efficiencies comparable to the implementations described in the present disclosure. Indeed, implementations described in the present disclosure describes isolating thermally the production of thermal energy from the photo-electric power generation while allowing the light to pass from the photo-electric layer to the thermal collection layer. This in situ isolation on the photovoltaic panel can provide a system with high overall efficiency by virtue of reduced loss of thermal energy during heat collection and increased photon conversion when operating solely in photo-electric mode.

Figure 5:
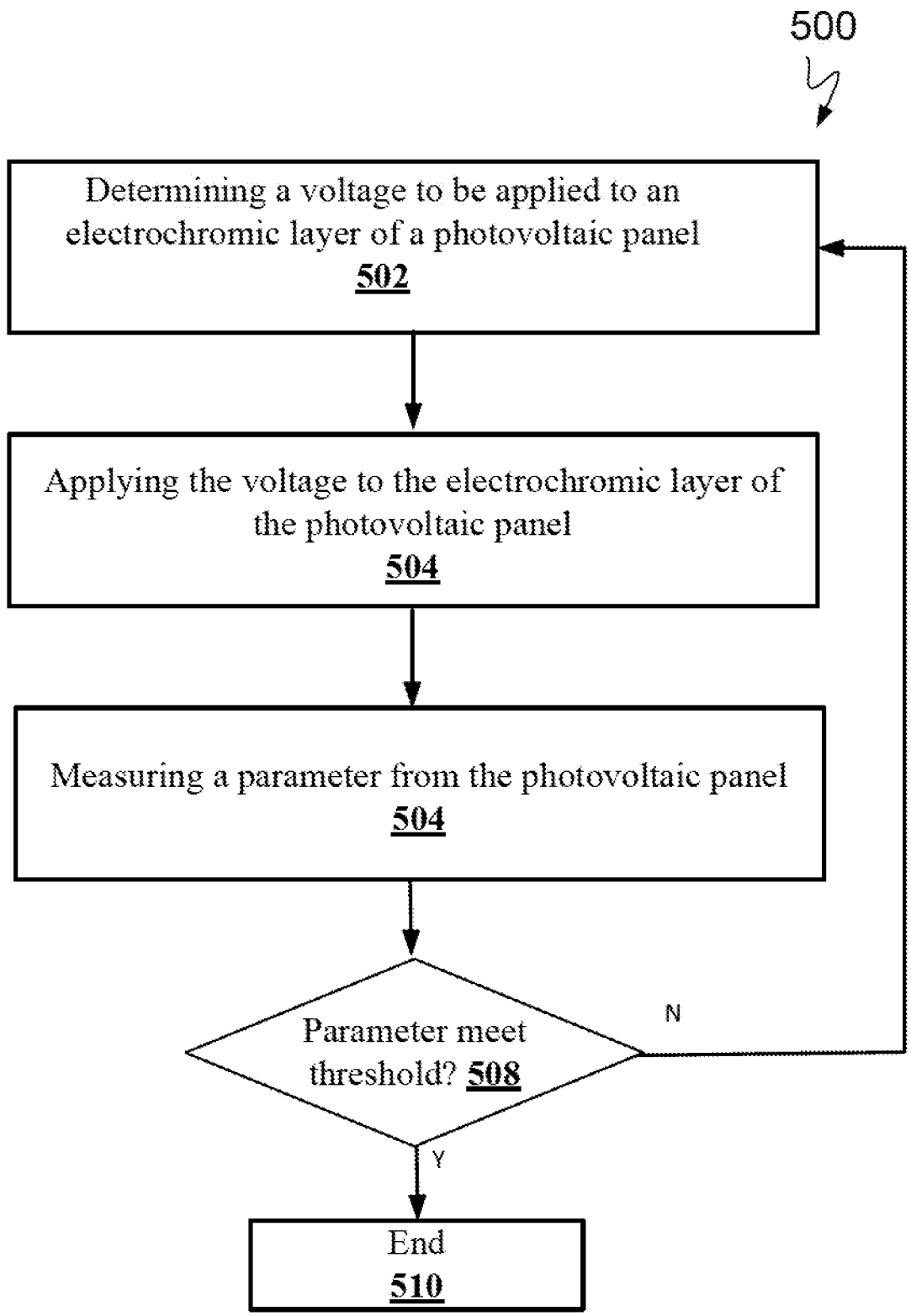
FIG. 5 illustrates an example of a flow chart according to an implementation of the present disclosure.

FIG. 5 is a flow chart 500 illustrating an example of adjusting a photovoltaic panel according to some implementations. The process initially determines a voltage to be applied to a photochromic layer of the photovoltaic panel (502). Referring to the example described in FIG. 4, the photovoltaic panel may include a photovoltaic layer, a transparent layer, a photochromic layer, and a thermal collection layer. The photochromic layer is adjustable by a voltage to control a portion of solar power that passes through the photovoltaic (PV) layer to reach the thermal collection layer. In one example, the transparent layer includes thermally insulation material to provide a thermal barrier between the photovoltaic layer and the thermal collection layer such that the PV layer is operated at a temperature lower than a temperature of the thermal collection layers. Using the determined voltage, the process then applies an adjusted voltage to adjust a portion of the solar power that passes through the PV layer to reach the thermal collection layer (504). As a result of the adjustment, in some cases, an increased portion of the incident solar power is harvested for electricity generation, while in other cases, an increased portion of the incident solar power is directed to the thermal collection layer to generate heat. In some cases, a parameter on the PV panel may be measured (506). In some cases, the parameter may be a temperature from the thermal collection layer or the PV layer. In another example, the parameter can be an amount of electricity generated or an amount of heat generated. In yet another example, the parameter can be an environmental variable like the solar irradiation, ambient temperature or humidity. In this example, the ambient variable may be analyzed to determine the amount of electricity expected or an amount of thermal energy expected. The measured parameter may be compared with a threshold (508). If the measured parameter has not reached the threshold, the process may proceed to additional determination of the voltage and adjustment of the control voltage (502 and 504). If the measurement parameter has reached the threshold, the process may terminate (510). In some configurations, the target threshold can be provided by the building management system (BMS) that manages and optimize energy usage in the building.

Figure 6:
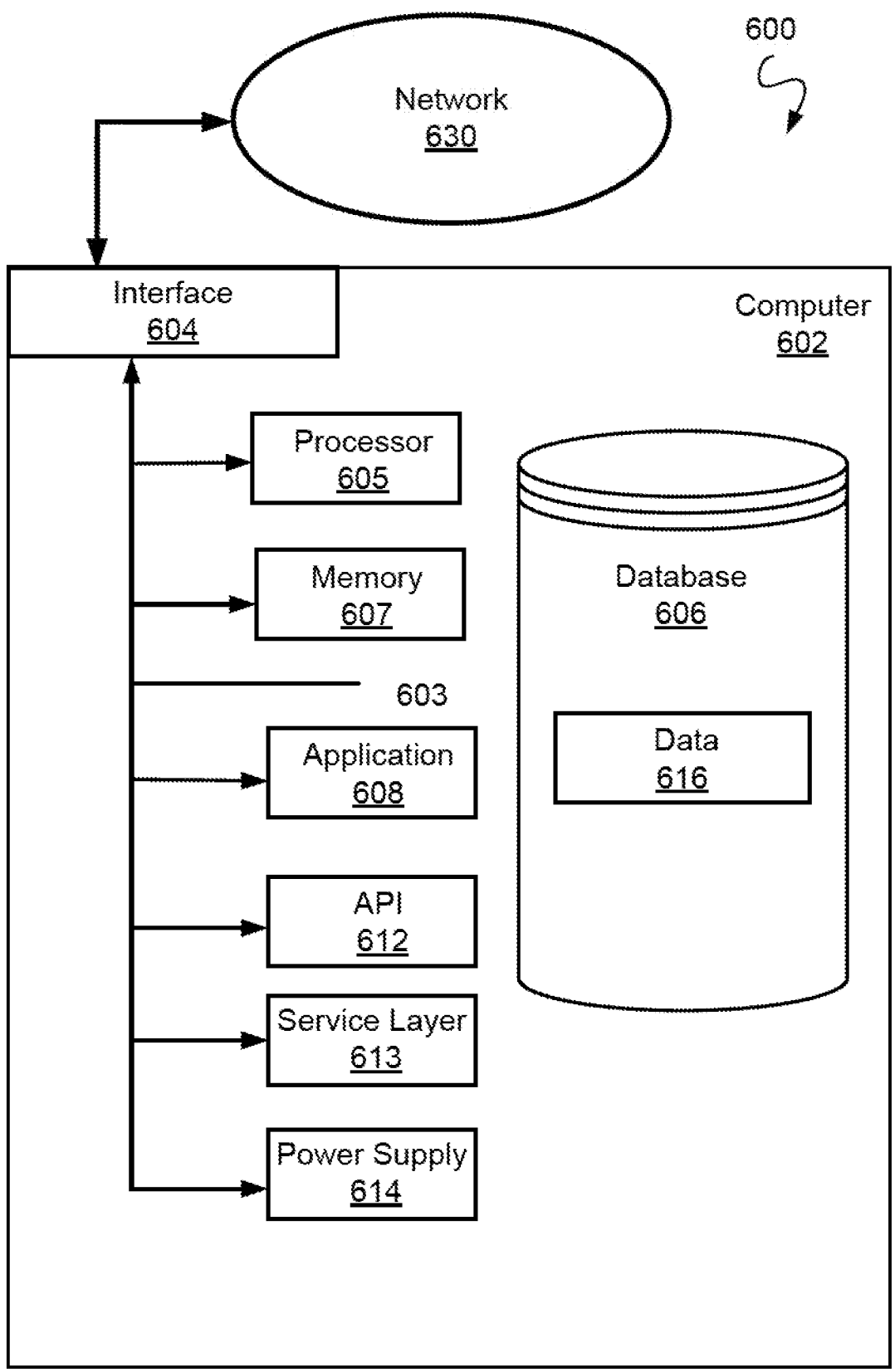
FIG. 6 is a block diagram illustrating an example of a computer system used to provide computational functionalities associated with described algorithms, methods, functions, processes, flows, and procedures, according to an implementation of the present disclosure.

FIG. 6 is a block diagram illustrating an example of a computer system 600 used to provide computational functionalities associated with described algorithms, methods, functions, processes, flows, and procedures, according to an implementation of the present disclosure. The illustrated computer 602 is intended to encompass any computing device such as a server, desktop computer, laptop/notebook computer, wireless data port, smart phone, personal data assistant (PDA), tablet computing device, programmable logic controller (PLC) one or more processors within these devices, another computing device, or a combination of computing devices, including physical or virtual instances of the computing device, or a combination of physical or virtual instances of the computing device. Additionally, the computer 602 can comprise a computer that includes an input device, such as a keypad, keyboard, touch screen, another input device, or a combination of input devices that can accept user information, and an output device that conveys information associated with the operation of the computer 602, including digital data, visual, audio, another type of information, or a combination of types of information, on a graphical-type user interface (UI) (or GUI) or other UI.

The computer 602 can serve in a role in a computer system as a client, network component, a server, a database or another persistency, another role, or a combination of roles for performing the subject matter described in the present disclosure. The illustrated computer 602 is communicably coupled with a network 630. In some implementations, one or more components of the computer 602 can be configured to operate within an environment, including cloud-computing-based, local, global, another environment, or a combination of environments.

The computer 602 is an electronic computing device operable to receive, transmit, process, store, or manage data and information associated with the described subject matter. According to some implementations, the computer 602 can also include or be communicably coupled with a server, including an application server, e-mail server, web server, caching server, streaming data server, another server, or a combination of servers.

The computer 602 can receive requests over network 630 (for example, from a client software application executing on another computer 602) and respond to the received requests by processing the received requests using a software application or a combination of software applications. In addition, requests can also be sent to the computer 602 from internal users, external or third-parties, or other entities, individuals, systems, or computers.

Each of the components of the computer 602 can communicate using a system bus 603. In some implementations, any or all of the components of the computer 602, including hardware, software, or a combination of hardware and software, can interface over the system bus 603 using an application programming interface (API) 612, a service layer 613, or a combination of the API 612 and service layer 613. The API 612 can include specifications for routines, data structures, and object classes. The API 612 can be either computer-language independent or dependent and refer to a complete interface, a single function, or even a set of APIs. The service layer 613 provides software services to the computer 602 or other components (whether illustrated or not) that are communicably coupled to the computer 602. The functionality of the computer 602 can be accessible for all service consumers using this service layer. Software services, such as those provided by the service layer 613, provide reusable, defined functionalities through a defined interface. For example, the interface can be software written in JAVA, C++, another computing language, or a combination of computing languages providing data in extensible markup language (XML) format, another format, or a combination of formats. While illustrated as an integrated component of the computer 602, alternative implementations can illustrate the API 612 or the service layer 613 as stand-alone components in relation to other components of the computer 602 or other components (whether illustrated or not) that are communicably coupled to the computer 602. Moreover, any or all parts of the API 612 or the service layer 613 can be implemented as a child or a sub-module of another software module, enterprise application, or hardware module without departing from the scope of the present disclosure.

The computer 602 includes an interface 604. Although illustrated as a single interface 604 in FIG. 6, two or more interfaces 604 can be used according to particular needs, desires, or particular implementations of the computer 602. The interface 604 is used by the computer 602 for communicating with another computing system (whether illustrated or not) that is communicatively linked to the network 630 in a distributed environment. Generally, the interface 604 is operable to communicate with the network 630 and comprises logic encoded in software, hardware, or a combination of software and hardware. More specifically, the interface 604 can comprise software supporting one or more communication protocols associated with communications such that the network 630 or interface's hardware is operable to communicate physical signals within and outside of the illustrated computer 602.

The computer 602 includes a processor 605. Although illustrated as a single processor 605 in FIG. 6, two or more processors can be used according to particular needs, desires, or particular implementations of the computer 602. Generally, the processor 605 executes instructions and manipulates data to perform the operations of the computer 602 and any algorithms, methods, functions, processes, flows, and procedures as described in the present disclosure.

The computer 602 also includes a database 606 that can hold data for the computer 602, another component communicatively linked to the network 630 (whether illustrated or not), or a combination of the computer 602 and another component. For example, database 606 can be an in-memory, conventional, or another type of database storing data consistent with the present disclosure. In some implementations, database 606 can be a combination of two or more different database types (for example, a hybrid in-memory and conventional database) according to particular needs, desires, or particular implementations of the computer 602 and the described functionality. Although illustrated as a single database 606 in FIG. 6, two or more databases of similar or differing types can be used according to particular needs, desires, or particular implementations of the computer 602 and the described functionality. While database 606 is illustrated as an integral component of the computer 602, in alternative implementations, database 606 can be external to the computer 602. In some examples, the database 606 holds data 616 encoding the measured parameters as previously described in association with, for example, FIG. 5. These parameters can include, for example, voltage, temperature, electricity generation, thermal heat generation, ambient temperature and humidity. In these examples, the database 606 may serve profile histories of each layer of various PV panels and at various locations.

The computer 602 also includes a memory 607 that can hold data for the computer 602, another component or components communicatively linked to the network 630 (whether illustrated or not), or a combination of the computer 602 and another component. Memory 607 can store any data consistent with the present disclosure. In some implementations, memory 607 can be a combination of two or more different types of memory (for example, a combination of semiconductor and magnetic storage) according to particular needs, desires, or particular implementations of the computer 602 and the described functionality. Although illustrated as a single memory 607 in FIG. 6, two or more memories 607 or similar or differing types can be used according to particular needs, desires, or particular implementations of the computer 602 and the described functionality. While memory 607 is illustrated as an integral component of the computer 602, in alternative implementations, memory 607 can be external to the computer 602.

The application 608 is an algorithmic software engine providing functionality according to particular needs, desires, or particular implementations of the computer 602, particularly with respect to functionality described in the present disclosure. For example, application 608 can serve as one or more components, modules, or applications. Further, although illustrated as a single application 608, the application 608 can be implemented as multiple applications 608 on the computer 602. In addition, although illustrated as integral to the computer 602, in alternative implementations, the application 608 can be external to the computer 602.

The computer 602 can also include a power supply 614. The power supply 614 can include a rechargeable or non-rechargeable battery that can be configured to be either user- or non-user-replaceable. In some implementations, the power supply 614 can include power-conversion or management circuits (including recharging, standby, or another power management functionality). In some implementations, the power-supply 614 can include a power plug to allow the computer 602 to be plugged into a wall socket or another power source to, for example, power the computer 602 or recharge a rechargeable battery.

There can be any number of computers 602 associated with, or external to, a computer system containing computer 602, each computer 602 communicating over network 630. Further, the term "client," "user," or other appropriate terminology can be used interchangeably, as appropriate, without departing from the scope of the present disclosure. Moreover, the present disclosure contemplates that many users can use one computer 602, or that one user can use multiple computers 602.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to a receiver apparatus for execution by a data processing apparatus. The computer-storage medium can be a machine-readable storage device, a machine-readable storage substrate, a random or serial access memory device, or a combination of computer-storage mediums. Configuring one or more computers means that the one or more computers have installed hardware, firmware, or software (or combinations of hardware, firmware, and software) so that when the software is executed by the one or more computers, particular computing operations are performed.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring substantially simultaneously. For example, the time difference for a response to display (or for an initiation of a display) of data following the individual's action to access the data can be less than 1 millisecond (ms), less than 1 second (s), or less than 5 s. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be, or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with an operating system of some type, for example LINUX, UNIX, WINDOWS, MAC OS, ANDROID, IOS, another operating system, or a combination of operating systems.

A computer program, which can also be referred to or described as a program, software, a software application, a unit, a module, a software module, a script, code, or other component can be written in any form of programming language, including compiled or interpreted languages, or declarative or procedural languages, and it can be deployed in any form, including, for example, as a stand-alone program, module, component, or subroutine, for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network.

While portions of the programs illustrated in the various figures can be illustrated as individual components, such as units or modules, that implement described features and functionality using various objects, methods, or other processes, the programs can instead include a number of sub-units, sub-modules, third-party services, components, libraries, and other components, as appropriate. Conversely, the features and functionality of various components can be combined into single components, as appropriate. Thresholds used to make computational determinations can be statically, dynamically, or both statically and dynamically determined.

Described methods, processes, or logic flows represent one or more examples of functionality consistent with the present disclosure and are not intended to limit the disclosure to the described or illustrated implementations, but to be accorded the widest scope consistent with described principles and features. The described methods, processes, or logic flows can be performed by one or more programmable computers executing one or more computer programs to perform functions by operating on input data and generating output data. The methods, processes, or logic flows can also be performed by, and apparatus can also be implemented as, special purpose logic circuitry, for example, a CPU, an FPGA, or an ASIC.

Computers for the execution of a computer program can be based on general or special purpose microprocessors, both, or another type of CPU. Generally, a CPU will receive instructions and data from and write to a memory. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable memory storage device.

Non-transitory computer-readable media for storing computer program instructions and data can include all forms of media and memory devices, magnetic devices, magneto optical disks, and optical memory device. Memory devices include semiconductor memory devices, for example, random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Magnetic devices include, for example, tape, cartridges, cassettes, internal/removable disks. Optical memory devices include, for example, digital video disc (DVD), CD-ROM, DVD+/−

R, DVD-RAM, DVD-ROM, HD-DVD, and BLURAY, and other optical memory technologies. The memory can store various objects or data, including caches, classes, frameworks, applications, modules, backup data, jobs, web pages, web page templates, data structures, database tables, repositories storing dynamic information, or other appropriate information including any parameters, variables, algorithms, instructions, rules, constraints, or references. Additionally, the memory can include other appropriate data, such as logs, policies, security or access data, or reporting files. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input can also be provided to the computer using a touchscreen, such as a tablet computer surface with pressure sensitivity, a multi-touch screen using capacitive or electric sensing, or another type of touchscreen. Other types of devices can be used to interact with the user. For example, feedback provided to the user can be any form of sensory feedback. Input from the user can be received in any form, including acoustic, speech, or tactile input. In addition, a computer can interact with the user by sending documents to and receiving documents from a client computing device that is used by the user.

The term "graphical user interface," or "GUI," can be used in the singular or the plural to describe one or more graphical user interfaces and each of the displays of a particular graphical user interface. Therefore, a GUI can represent any graphical user interface, including but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with the present disclosure), all or a portion of the Internet, another communication network, or a combination of communication networks. The communication network can communicate with, for example, Internet Protocol (IP) packets, Frame Relay frames, Asynchronous Transfer Mode (ATM) cells, voice, video, data, or other information between networks addresses.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what can be claimed, but rather as descriptions of features that can be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features can be described as acting in certain combinations and even initially claimed as such, one or more features from a claimed combination can, in some cases, be excised from the combination, and the claimed combination can be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations can be considered optional), to achieve desirable results. In certain circumstances, multitasking or parallel processing (or a combination of multitasking and parallel processing) can be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A hybrid photovoltaic (PV) panel, comprising:
a first photovoltaic (PV) layer comprising photovoltaic cells capable of converting energy from incident solar power into electricity;
a second transparent layer arranged underneath the first PV layer such that a portion of the incident solar power passes through;
a third thermal collection layer arranged underneath the second transparent layer and comprising absorbing material capable of capturing thermal energy from the portion of the incident solar power that has passed through the second transparent layer; and a fourth electrochromic layer located between the first PV layer and the third thermal collection layer and configured to dynamically control, based at least on an electricity demand and a thermal energy demand, the portion of the incident solar power that passes through the first PV layer to reach the third thermal collection layer such that when the electricity demand is increased, the portion of the incident solar power that reaches the third thermal collection layer is reduced and when the thermal energy demand is increased, the portion of the incident solar power that reaches the third thermal collection layer is increased, wherein the second transparent layer comprises a thermally insulating material to provide a thermal barrier between the first PV layer and the third thermal collection layer such that when the hybrid PV panel is operated, the first PV layer operates at a temperature lower than a temperature of the third thermal collection layer, and the fourth electrochromic layer operates at a range between about −20° C. and about 150° C. that is broader than an ambient temperature, and wherein the thermally insulating material is characterized by a molar ratio (NH4OH-to-TMOS) between $1 \times 10^{-3}$ and $1 \times 10^{-4}$, wherein the fourth electrochromic layer is sandwiched between the first PV layer and the second transparent layer.

2. The hybrid PV panel of claim 1, wherein the fourth electrochromic layer is switchable between a first state and a second state, wherein the first state allows a majority of the portion of the incident solar power to reach the third thermal collection layer, and wherein the second state reflects a majority of the portion of the incident solar power to the first PV layer.

3. The hybrid PV panel of claim 2, wherein the fourth electrochromic layer is adjustable by a voltage to switch between the first state and the second state.

4. The hybrid PV panel of claim 1, wherein the fourth electrochromic layer is constructed as part of the second transparent layer.

5. The hybrid PV panel of claim 1, wherein the fourth electrochromic layer is constructed as part of the third thermal collection layer.

6. The hybrid PV panel of claim 1, wherein the fourth electrochromic layer has a thickness between about 1 micrometer and about 3 millimeter.

7. The hybrid PV panel of claim 1, wherein the first PV layer comprises a plurality of transparent solar cells encapsulated in a polymer material, wherein the plurality of transparent solar cells comprise one of: an organic silicon material, an amorphous silicon material, or a crystalline silicon material, and wherein the polymer material comprises ethyl vinyl acetate (EVA).

8. The hybrid PV panel of claim 1, further comprising a fifth layer located underneath the third thermal collection layer, wherein the third thermal collection layer is configured to transfer the thermal energy captured from the portion of the incident solar power to the fifth layer by conduction and convection.

9. The hybrid PV panel of claim 1, further comprising a sixth transparent layer coated on the first PV layer, wherein the sixth transparent layer comprises a glass or a polymer to allow the incident solar power to pass through to the first PV layer.

10. The hybrid PV panel of claim 1, wherein the first PV layer include solar photovoltaic cells to produce electricity from incident and reflected photons.

11. A method for operating a hybrid photovoltaic (PV) panel comprising a first photovoltaic (PV) layer comprising photovoltaic cells capable of converting energy from incident solar power into electricity; a second transparent layer arranged underneath the first PV layer such that a portion of the incident solar power passes through; a third thermal collection layer arranged underneath the second transparent layer and comprising absorbing material capable of capturing thermal energy from the portion of the incident solar power that has passed through the second transparent layer; and a fourth electrochromic layer located between the first PV layer and the third thermal collection layer, the method comprising:

dynamically controlling the fourth electrochromic layer, based at least on an electricity demand and a thermal energy demand, the portion of the incident solar power that passes through the first PV layer to reach the third thermal collection layer such that when the electricity demand is increased, the portion of the incident solar power that reaches the third thermal collection layer is reduced and when the thermal energy demand is increased, the portion of the incident solar power that reaches the third thermal collection layer is increased; and providing, using a thermally insulating material in the second transparent layer, a thermal barrier between the first PV layer and the third thermal collection layer such that when the hybrid PV panel is operated, the first PV layer operates at a temperature lower than a temperature of the third thermal collection layer, and the fourth electrochromic layer operates at a range between about −20° C. and about 150° C. that is broader than an ambient temperature, wherein the thermally insulating material is characterized by a molar ratio (NH4OH-to-TMOS) between $1 \times 10^{-3}$ and $1 \times 10^{-4}$, and wherein the fourth electrochromic layer is sandwiched between the first PV layer and the second transparent layer.

12. The method of claim 11, wherein dynamically controlling the fourth electrochromic layer causes the fourth electrochromic layer to switch between a first state and a second state, wherein the first state allows a majority of the portion of the incident solar power to reach the third thermal collection layer, and wherein the second state reflects a majority of the portion of the incident solar power to the first PV layer.

13. The method of claim 11, wherein dynamically controlling the fourth electrochromic layer comprises adjusting a voltage to switch the fourth electrochromic layer from a first state to a second.

* * * * *

UNITED STATES PATENT AND TRADEMARK OFFICE
CERTIFICATE OF CORRECTION

| | | |
|---|---|---|
| PATENT NO. | : 11,588,436 B2 | |
| APPLICATION NO. | : 16/928732 | |
| DATED | : February 21, 2023 | |
| INVENTOR(S) | : Mourad Younes and Issam Gereige | |

It is certified that error appears in the above-identified patent and that said Letters Patent is hereby corrected as shown below:

In the Claims

Column 15, Claim 1, Line 29, delete "laver." and insert -- layer. --.

Column 16, Claim 10, Line 5, after "include" insert -- bi-facial --.

Column 16, Claim 13, Line 62, delete "second." and insert -- second state. --.

Signed and Sealed this
Eighteenth Day of April, 2023

Katherine Kelly Vidal
*Director of the United States Patent and Trademark Office*